United States Patent
Modica

(10) Patent No.: US 7,088,581 B2
(45) Date of Patent: Aug. 8, 2006

(54) EXTERNAL FAN AND METHOD FOR EXCHANGING AIR WITH MODULAR BRICKS IN A COMPUTER SYSTEM

(75) Inventor: Steve Modica, Inver Grove Heights, MN (US)

(73) Assignee: Silicon Graphics, Inc., Mountain View, CA (US)

( * ) Notice: Subject to any disclaimer, the term of this patent is extended or adjusted under 35 U.S.C. 154(b) by 426 days.

(21) Appl. No.: 10/200,828

(22) Filed: Jul. 23, 2002

(65) Prior Publication Data

US 2004/0017654 A1    Jan. 29, 2004

(51) Int. Cl.
*G06F 1/20* (2006.01)
(52) U.S. Cl. ..................................... 361/687
(58) Field of Classification Search ............... 361/687, 361/683, 724–727, 695, 690, 692; 312/223.1–223.2, 312/265.5; 454/184, 252, 906; 174/35 R, 174/52.1; 165/80.3, 120, 126; 415/177, 415/178, 213.1, 214.1
See application file for complete search history.

(56) References Cited

U.S. PATENT DOCUMENTS

| | | | | |
|---|---|---|---|---|
| 3,903,404 A | * | 9/1975 | Beall et al. ................. | 361/687 |
| 5,000,079 A | * | 3/1991 | Mardis ........................ | 454/184 |
| 6,185,098 B1 | * | 2/2001 | Benavides ................... | 361/695 |
| 6,351,381 B1 | * | 2/2002 | Bilski et al. ................. | 361/695 |
| 6,452,805 B1 | * | 9/2002 | Franz et al. ................. | 361/724 |
| 6,525,937 B1 | * | 2/2003 | Yanagida .................... | 361/695 |
| 6,535,382 B1 | * | 3/2003 | Bishop et al. .............. | 361/690 |

* cited by examiner

*Primary Examiner*—Lisa Lea-Edmonds
(74) *Attorney, Agent, or Firm*—Schwegman, Lundberg, Woessner & Kluth, P.A.

(57) ABSTRACT

A modular computing system that includes an enclosure, a rack mounted inside the enclosure and a plurality of modular bricks. The modular bricks each include electronic components and are supported by the rack. The computing system further includes a floor tile supporting the enclosure. The floor tile includes a plurality of fans that exchange air with each of the modular bricks to cool the electronic components in each modular brick.

18 Claims, 2 Drawing Sheets

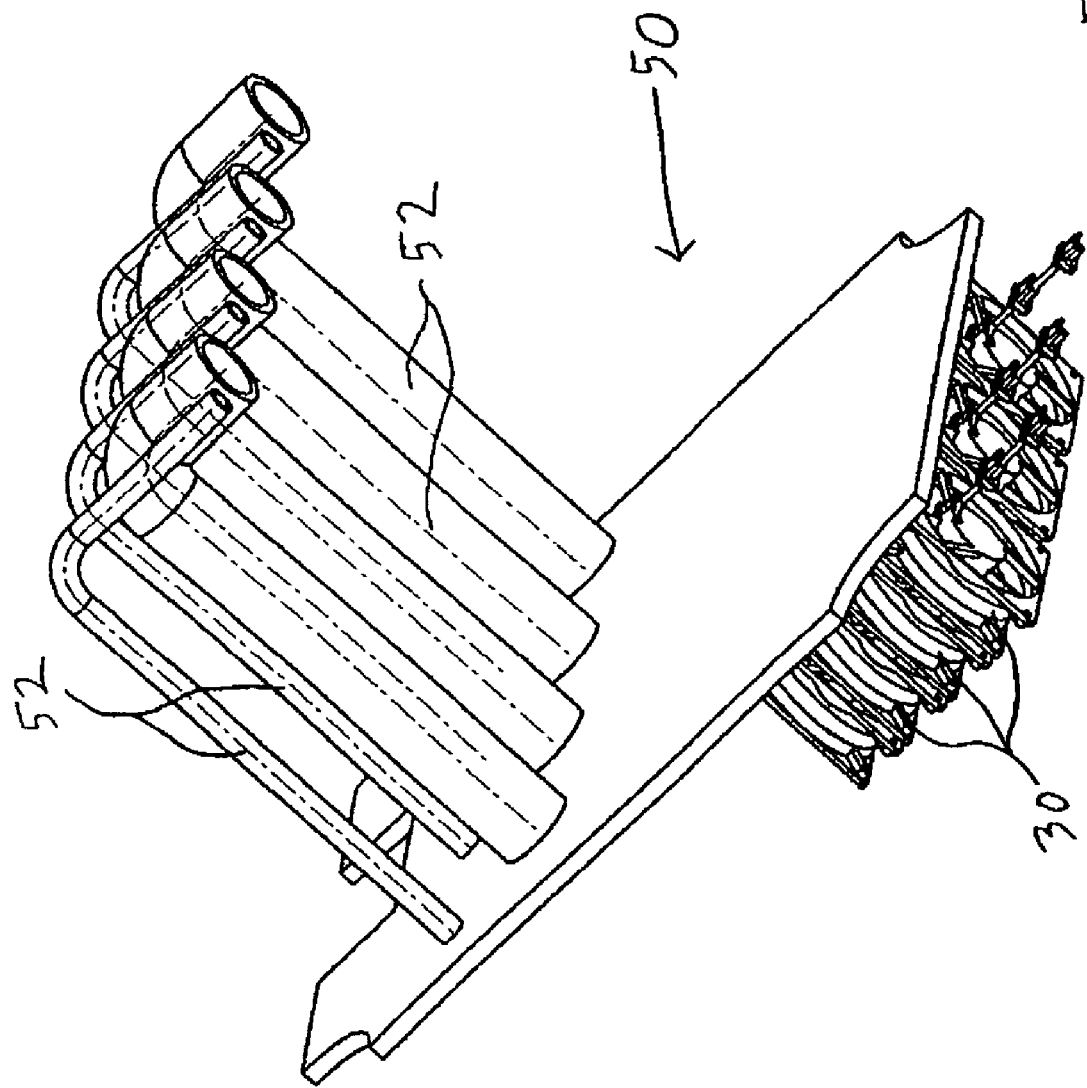

EXTERNAL FAN AND METHOD FOR EXCHANGING AIR WITH MODULAR BRICKS IN A COMPUTER SYSTEM

FIELD OF THE INVENTION

The present invention is related to computer system cooling, and more particularly to an external fan and method for exchanging air with modular bricks in a computer system.

BACKGROUND OF THE INVENTION

Modern computer systems typically generate a great deal of heat in a very small space. Some computer systems use air cooling techniques to draw heat away from critical components in the computer system. Air cooling is used on computers ranging from personal computers and laptops to minicomputer and mainframe systems. Air cooling systems typically use fans, or some other air moving device, to move air across electrical components in the computer system.

In conventional computer systems, fans are mounted inside of the system being cooled in order to either suck air from, or force air into, the computer system. Computer systems are continually being developed that pack more devices in smaller spaces such that there is a great deal of heat generated per unit volume. The cooling systems in such systems typically need to exchange large volumes of air to ensure that an adequate amount of heat is removed from the system. Failure to exchange adequate amounts of air can cause overheating that results in system error or failure.

Some computer systems are modular in that they are formed of one or more bricks that fit into a rack. Each brick typically contains its own electronics and fans to cool the electronics. The fans occupy valuable space within each brick that may otherwise be taken up by heat sinks and/or additional electronics. In addition, since the fans are positioned within each brick maintenance and/or replacement of a failed fan must typically be performed by qualified technicians because of potential physical and electrical dangers. The fans within each brick are also powered by currents that generate unwanted electromagnetic interference within the brick.

Thus, what is needed is a computer system and method for efficiently exchanging air with modular bricks in a brick-based computer system. The computer system and method should reduce downtime due to fan failure while at the same time exchanging adequate amounts of air through each modular brick. It would also be desirable if such a system and method utilized no space within each brick and permitted fan replacement by non-technical workers while the electronics system was running.

SUMMARY OF THE INVENTION

An external fan and method for exchanging air with modular bricks in a brick-based computer system. The external fan and method allow computer system designers to place fans, or some other air moving device, outside of the enclosure that contains the modular bricks.

Placing the fans outside of the enclosure allows the fans to be replaced by non-technical workers while the electronics system is still running. In addition, computer system designers are able to locate additional electronics and/or heat sinks within the enclosure.

The fans are also more easily powered by a separate power source that no longer needs to be located within the enclosure. Removing the power source for the fans from the enclosure reduces the heat and electromagnetic interference that would otherwise be generated within the enclosure.

One aspect provides a modular computing system that include an enclosure, a rack mounted inside the enclosure, and a modular brick. The modular brick includes electronic components and is supported by the rack. A primary fan outside the enclosure exchanges air with the modular brick to cool the electronic components in the modular brick.

Another aspect provides a method of exchanging air with modular bricks in a brick-based computer system. The method includes placing a modular brick that includes electronic components onto a rack inside an enclosure, and using a primary fan located outside the enclosure to exchange air with the modular brick to cool the electronic components in the modular brick.

Still another aspect provides a modular computing system that includes an enclosure, a rack mounted inside the enclosure and a plurality of modular bricks. The modular bricks each include electronic components and are supported by the rack. The computing system further includes a floor tile supporting the enclosure. The floor tile includes a plurality of fans that exchange air with each of the modular bricks to cool the electronic components in each modular brick.

BRIEF DESCRIPTION OF THE DRAWINGS

FIG. 2 shows an example floor tile that may used in the computing system of FIG. 1.

DETAILED DESCRIPTION

Figure 1:
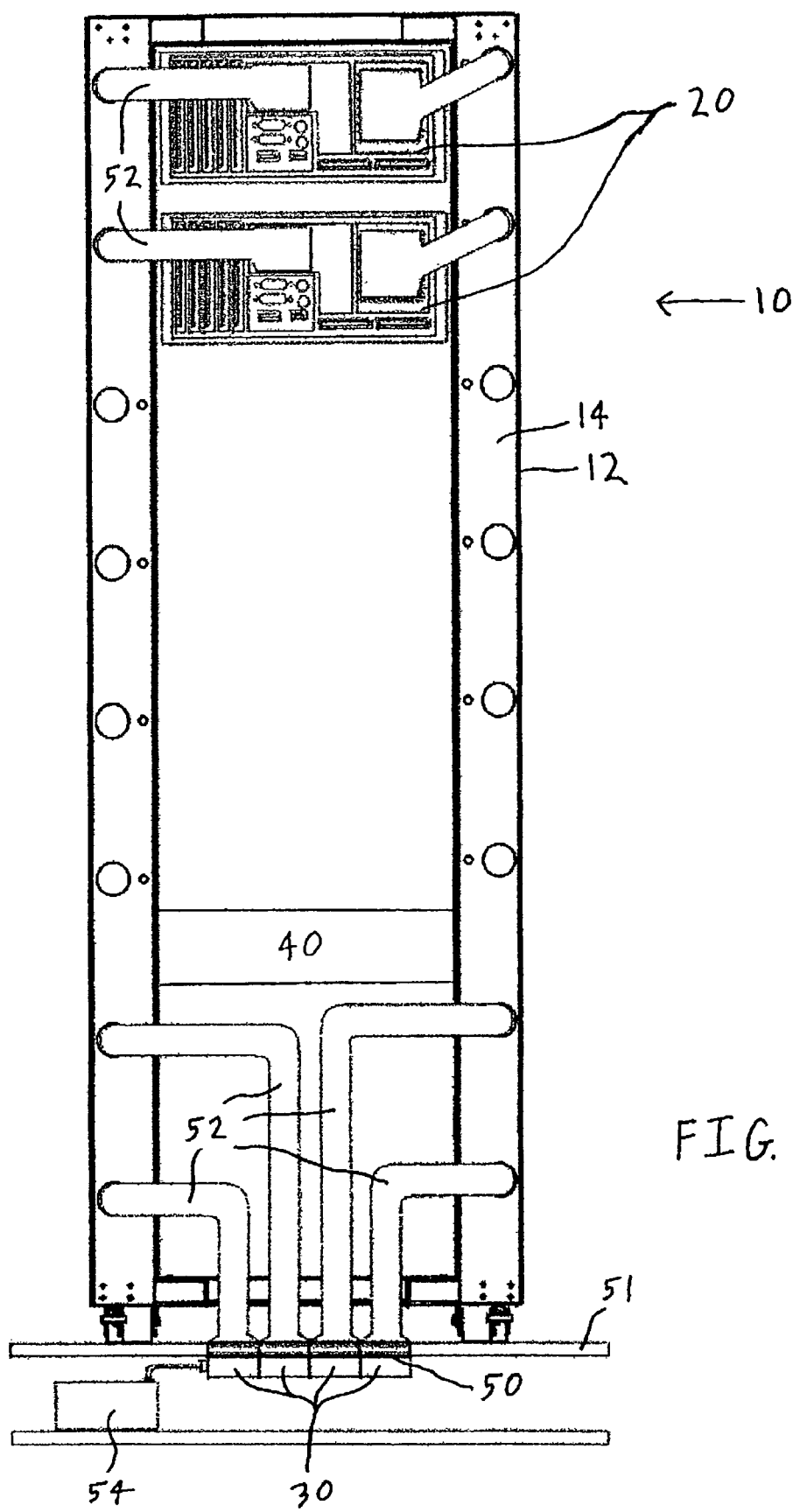
FIG. 1 shows a modular computing system.

In the following detailed description reference is made to the accompanying drawings that show by way of illustration specific embodiments. It is understood that other embodiments may be utilized and structural changes made.

FIG. 1 shows a modular computing system 10 that includes an enclosure 12 and a rack 14 that is mounted partially, or wholly, inside enclosure 12. Computing system 10 further includes one or more modular bricks 20 that include electronic components (normally not visible from the exterior of modular bricks 20) which are part of computing system 10. Modular bricks 20 are supported by rack 14. A primary fan or fans 30 located outside enclosure 12 exchanges air, or some other fluid, with modular bricks 20 to cool the electronic components in modular bricks 20. It should be noted that depending on the number of modular bricks 20 a primary fan or fans 30 may exchange air with one, some, or all of the modular bricks 20.

Depending on the arrangement of fans 30, air is either forced air into modular bricks 20, or drawn out of modular bricks 20, to cool the electronic components in modular bricks 20. As used herein, a fan is any device that moves air, including a blower or impeller among others.

As used herein, a brick is any stand-alone device that forms one component of system 10. Bricks may have, but are not required to have, their own power source. In the illustrated embodiment, each of the modular bricks 20 is the same size to promote the modular nature of brick-based computer system 10. Modular bricks 20 may be arranged in enclosure 12 at any angle in any orientation. In alternative embodiments, modular bricks 20 may be different sizes with each modular brick sized relative to a common unit, such as one-quarter size, one-half size etc.

In the embodiment illustrated in FIG. 1, primary fans 30 are part of a floor tile 50 that supports enclosure 12 of computing system 10. Floor tile 50 may be part of a raised floor 51. In some embodiments, enclosure 12 is bottomless such that air is exchanged between modular brick 20 and primary fans 30 through one or more conduits 52 that pass through the bottom of enclosure 12. It should be noted that modular bricks 20 and fans 30 may be connected by any conventional means.

The number and arrangement of fans 30 in floor tile 50 depends on the amount of air movement required for particular applications. FIG. 2 illustrates one alternative embodiment for floor tile 50. The amount of air movement that is needed to cool the electronic components in modular bricks 20 will be based in part on the number and type of modular bricks 20 that include electronic components.

Computing system 10 may also include a power source 54 that is outside enclosure 12. Power source 54 may be used to supply power to primary fans 30 and/or any secondary fans (not shown) independently from any other power sources that are used to provide power to any of the other components in computing system 10. Since power source 54 for fans 30 is outside enclosure 12, there is less heat and electromagnetic interference generated within enclosure 12, especially when compared to computing systems where the fans are powered by a power source within the enclosure.

In some embodiments, system 10 includes a controller 40 that detects when there is a malfunction in some, all or one of the primary fans 30. A secondary fan, or fans, may be outside enclosure 12 to exchange air with modular bricks 20 to cool the electronic components in the modular bricks 20 when controller 40 detects a malfunction in one or more of primary fans 30.

A method of exchanging air with modular bricks 20 in a brick-based computer system 10 is also shown in FIG. 1. The method includes placing one or more modular bricks 20 that include electronic components onto a rack 14 inside an enclosure 12, and using primary fans 30 located outside enclosure 12 to exchange air with modular bricks 20 to cool the electronic components in modular bricks 20. The method may further include using secondary fans (not shown) located outside enclosure 12 to exchange air with modular bricks 20 when there is a malfunction with primary fans 30.

In some embodiments, using a primary fan 30 to exchange air with modular brick 20 includes forcing air from the modular bricks 20 to primary fans 30, while in other embodiments using primary fans 30 to exchange air with modular bricks includes forcing air from primary fans 30 into modular bricks 20. Using primary fans 30 located outside enclosure 12 to exchange air with modular bricks 20 may also include positioning enclosure 12 above a floor tile 50 that includes primary fans 30 and exchanging air between primary fans 30 and modular bricks 20 through the bottom of enclosure 12.

The method may further include powering the modular bricks 20 using a first power source (not shown) and powering the primary fan 30 using a second power source 54 located outside enclosure 12. Locating power source 54 outside enclosure 12 reduces the heat and electromagnetic interference that would otherwise be generated in enclosure 12 by power source 54.

It is understood that the above description is intended to be illustrative, and not restrictive. Many other embodiments will be apparent to those of skill in the art upon reviewing the above description.

What is claimed is:

1. A modular computing system comprising:
    an enclosure;
    a rack mounted inside the enclosure;
    a modular brick that includes electronic components, the modular brick being supported by the rack;
    a primary fan outside the enclosure, the primary fan exchanging air with the modular brick to cool the electronic components in the modular brick; and
    a controller that detects when there is a malfunction in the primary fan.

2. The modular computing system of claim 1, further comprising at least one additional modular brick that includes electronic components, the primary fan exchanging air with each of the modular bricks to cool the electronic components in each modular brick.

3. The modular computing system of claim 2, wherein each modular brick is the same size.

4. The modular computing system of claim 1, further comprising a secondary fan outside the enclosure, the secondary fan exchanging air with the modular brick to cool the electronic components in the modular brick when the controller detects a malfunction in the primary fan.

5. The modular computing system of claim 1, wherein the primary fan is connected to the modular brick by conduits.

6. A modular computing system comprising:
    an enclosure;
    a rack mounted inside the enclosure;
    a modular brick that includes electronic components, the modular brick being supported by the rack; and
    a primary fan outside the enclosure, the primary fan exchanging air with the modular brick to cool the electronic components in the modular brick, wherein the primary fan is part of a floor tile that supports the enclosure of the computing system.

7. The modular computing system of claim 6, further comprising a power source outside the enclosure, the power source supplying power to the primary fan.

8. The modular computing system of claim 6, wherein the floor tile includes a plurality of fans that exchange air with the modular brick.

9. The modular computing system of claim 6, wherein the enclosure is bottomless such that air is exchanged between the modular brick and the primary fan through a bottom of the enclosure.

10. A method of exchanging air with modular bricks in a brick-based computer system comprising:
    placing a modular brick onto a rack inside an enclosure, the modular brick including electronic components;
    using a primary fan located outside the enclosure to exchange air with the modular brick to cool the electronic components in the modular brick; and
    using a secondary fan located outside the enclosure to exchange air with the modular brick when there is a malfunction with the primary fan.

11. The method according to claim 10, further comprising; placing at least one additional modular brick onto the rack inside the enclosure, each additional modular brick including electronic components; and using the primary fan located outside the enclosure to exchange air with each additional modular brick to cool the electronic components in each modular brick.

12. The method according to claim 10, wherein using the primary fan to exchange air with the modular brick includes forcing air from the modular brick to the primary fan.

13. The method according to claim 10, wherein using the primary fan to exchange air with the modular brick includes forcing air from the primary fan into the modular brick.

14. The method according to claim 10, further comprising powering the modular brick using a first power source and powering the primary fan using a second power source.

15. A method of exchanging air with modular bricks in a brick-based computer system comprising:
    placing a modular brick onto a rack inside an enclosure, the modular brick including electronic components; and
    using a primary fan located outside the enclosure to exchange air with the modular brick to cool the electronic components in the modular brick, wherein using the primary fan located outside the enclosure to exchange air with the modular brick includes positioning the enclosure above a floor tile that includes the primary fan.

16. The method according to claim 15, wherein using the primary fan located outside the enclosure to exchange air with the modular brick includes exchanging air between the primary fan and the modular brick through a bottom of the enclosure.

17. The method according to claim 15, wherein positioning the enclosure above a floor tile that includes the primary fan includes positioning the enclosure above a floor tile that includes a plurality of fans.

18. A modular computing system, comprising:

an enclosure;

a rack mounted inside the enclosure;

a plurality of modular bricks supported by the rack, each modular brick including electronic components; and a floor tile supporting the enclosure, the floor tile including a plurality of fans to exchange air with each of the modular bricks to cool the electronic components in each modular brick.

* * * * *

UNITED STATES PATENT AND TRADEMARK OFFICE
CERTIFICATE OF CORRECTION

PATENT NO. : 7,088,581 B2
APPLICATION NO. : 10/200828
DATED : August 8, 2006
INVENTOR(S) : Modica It is certified that error appears in the above-identified patent and that said Letters Patent is hereby corrected as shown below:

On the face page, in field (56), under "U.S. Patent Documents", in column 2, line 6, after "6,525,937" delete "B1" and insert -- B2 --, therefor.

On the face page, in-field (56), under "U.S. Patent Documents", in column 2, line 7, after "6,535,382" delete "B1" and insert -- B2 --, therefor.

In column 4, line 11, in Claim 5, delete "claim 1," and insert -- claim 1 --, therefor.

In column 4, line 23, in Claim 7, delete "claim 6," and insert -- claim 6 --, therefor.

In column 4, line 26, in Claim 8, delete "claim 6," and insert -- claim 6 --, therefor.

In column 4, line 29, in Claim 9, delete "claim 6," and insert -- claim 6 --, therefor.

In column 4, line 43, in Claim 11, delete "claim 10," and insert -- claim 10 --, therefor.

In column 4, line 50, in Claim 12, delete "claim 10," and insert -- claim 10 --, therefor.

In column 4, line 53, in Claim 13, delete "claim 10," and insert -- claim 10 --, therefor.

In column 4, line 56, in Claim 14, delete "claim 10," and insert -- claim 10 --, therefor.

In column 5, line 4, in Claim 16, delete "claim 15," and insert -- claim 15 --, therefor.

In column 5, line 9, in Claim 17, delete "claim 15," and insert -- claim 15 --, therefor.

Signed and Sealed this

Twelfth Day of December, 2006

JON W. DUDAS
*Director of the United States Patent and Trademark Office*